(12) United States Patent
Feichtinger et al.

(10) Patent No.: US 11,462,476 B2
(45) Date of Patent: Oct. 4, 2022

(54) ELECTRONIC DEVICE

(71) Applicant: TDK Electronics AG, Munich (DE)

(72) Inventors: Thomas Feichtinger, Graz (AT);
Johann Pichler, Breitenau Am Hochlantsch (AT); Nele Reimer, Graz (AT); Markus Koini, Seiersberg (AT); Manfred Schweinzger, Schwanberg (AT)

(73) Assignee: TDK ELECTRONICS AG, Munich (DE)

( * ) Notice: Subject to any disclaimer, the term of this patent is extended or adjusted under 35 U.S.C. 154(b) by 0 days.

(21) Appl. No.: 16/961,078

(22) PCT Filed: Jan. 30, 2019

(86) PCT No.: PCT/EP2019/052293
§ 371 (c)(1),
(2) Date: Jul. 9, 2020

(87) PCT Pub. No.: WO2019/149778
PCT Pub. Date: Aug. 8, 2019

(65) Prior Publication Data
US 2021/0066199 A1 Mar. 4, 2021

(30) Foreign Application Priority Data
Jan. 31, 2018 (DE) .......................... 102018102144.5

(51) Int. Cl.
*H01L 23/532* (2006.01)
*H01L 23/15* (2006.01)
*H01L 23/36* (2006.01)

(52) U.S. Cl.
CPC ........ *H01L 23/53233* (2013.01); *H01L 23/15* (2013.01); *H01L 23/36* (2013.01); *H01L 23/53247* (2013.01)

(58) Field of Classification Search
CPC ... H01L 23/53233; H01L 23/15; H01L 23/36; H01L 23/53247
See application file for complete search history.

(56) References Cited

U.S. PATENT DOCUMENTS 5,583,377 A * 12/1996 Higgins, III ............ H01L 23/13
257/706
5,977,631 A * 11/1999 Notani .................... H01L 23/66
257/664
6,212,070 B1 * 4/2001 Atwood .............. H01L 23/4006
165/80.2

(Continued)

FOREIGN PATENT DOCUMENTS

DE 102007036045 A1 2/2009
DE 102013015960 A1 4/2014

(Continued)

OTHER PUBLICATIONS

Schweizer Electronics GMBH, "Power Combi Board," https://www.schweizer.ag/en/products-solutions/power-electronics/power-combi-board.html, Dec. 22, 2020, 1 page.

*Primary Examiner* — Eugene Lee
(74) *Attorney, Agent, or Firm* — Slater Matsil, LLP

(57) ABSTRACT

An electronic device is disclosed. In an embodiment an electronic device includes at least one first carrier and at least one semiconductor chip, wherein the first carrier has a cavity in which the semiconductor chip is arranged.

17 Claims, 2 Drawing Sheets

(56) References Cited

U.S. PATENT DOCUMENTS

| | | | |
|---|---|---|---|
| 6,538,210 B2 * | 3/2003 | Sugaya | H01L 21/56 174/258 |
| 6,931,725 B2 * | 8/2005 | Sugaya | H01L 21/56 257/E21.502 |
| 6,974,724 B2 * | 12/2005 | Hyvonen | H01L 23/552 438/107 |
| 7,317,621 B2 | 1/2008 | Kimura et al. | |
| 7,342,305 B1 * | 3/2008 | Diao | H01L 23/13 257/706 |
| 7,358,604 B2 | 4/2008 | Heyen et al. | |
| 7,791,189 B2 * | 9/2010 | Zhao | H01L 23/3128 257/710 |
| 9,064,758 B2 * | 6/2015 | Yano | H01L 23/057 |
| 9,202,782 B2 * | 12/2015 | Chuah | H01L 23/49833 |
| 9,355,997 B2 * | 5/2016 | Katkar | H01L 23/147 |
| 10,312,193 B2 * | 6/2019 | Gu | H01L 21/486 |
| 2003/0169575 A1 | 9/2003 | Ikuta et al. | |
| 2005/0127489 A1 * | 6/2005 | Mallik | H01L 23/04 257/686 |
| 2007/0139899 A1 * | 6/2007 | Van Schuylenbergh | H01L 23/552 361/760 |
| 2010/0216280 A1 | 8/2010 | Smeys et al. | |
| 2011/0156228 A1 * | 6/2011 | Kobayashi | H01L 23/3677 257/676 |
| 2012/0139095 A1 * | 6/2012 | Manusharow | H01L 23/564 257/690 |
| 2012/0292785 A1 * | 11/2012 | Pagaila | H01L 25/0657 257/774 |
| 2015/0257273 A1 | 9/2015 | Nanjo | |
| 2015/0262902 A1 | 9/2015 | Shen et al. | |
| 2017/0025393 A1 * | 1/2017 | Lin | H01L 21/6835 |
| 2017/0084553 A1 * | 3/2017 | Jiang | H01L 23/13 |
| 2018/0061725 A1 * | 3/2018 | Meliane | H01L 23/49833 |

FOREIGN PATENT DOCUMENTS

| | | |
|---|---|---|
| EP | 10336171 B3 | 2/2005 |
| EP | 2988328 A1 | 2/2016 |
| JP | 2002359327 A | 12/2002 |
| JP | 2005158770 A | 6/2005 |
| JP | 2010080683 A | 4/2010 |
| JP | 2011222662 A | 11/2011 |
| JP | 2013051401 A | 3/2013 |
| JP | 2014053575 A | 3/2014 |

* cited by examiner

ELECTRONIC DEVICE

This patent application is a national phase filing under section 371 of PCT/EP2019/052293, filed Jan. 30, 2019, which claims the priority of German patent application 102018102144.5, filed Jan. 31, 2018, each of which is incorporated herein by reference in its entirety.

TECHNICAL FIELD

An electronic device is specified. For example, the electronic device can be embodied as a power module with integrated functional structures.

BACKGROUND

Efforts are being made to manufacture electronic devices, in particular power modules, so-called "system power packages", which when miniaturized have a higher power density and a higher mechanical and, in particular, thermo-mechanical resistance. As part of this, for example, in applications with power semiconductors and LEDs (LED: "light-emitting diode"), the trend is towards higher operating temperatures, namely of around 125° C. to 175° C. or more.

A glass- and/or epoxy resin-based laminate technology for producing so-called power-PCBs (PCB: "printed circuit board") allows for the integration of thermally conductive structures and passive and active components via a so-called "embedding process". There is a limitation, however, for example, in the lack of feasibility of very small thermal resistors.

Even the LTCC technology (LTCC: "low temperature co-fired ceramics") based on glass ceramics is of very limited use for the implementation of thermally conductive paths, due to the low thermal conductivity of glass ceramics.

AlN-based technologies, on the other hand, which can exhibit good thermal conductivities, are currently limited to surface-mounted components, for example, wire-bonded components or components applied by soldering using SMD technology (SMD: "surface-mount device").

TSV technology (TSV: "through-silicon via") allows a very high degree of integration. This technology, as a result of the reduced mechanical strength (less than 200 MPa), is usable to a limited amount for MEMS applications (MEMS: "micro-electromechanical system"), but not for power modules with high thermomechanical stress profiles.

SUMMARY

Embodiments provide an electronic device.

According to at least one embodiment, an electronic device has at least one semiconductor chip. The semiconductor chip, for example, can comprise a transistor or be a transistor, for example, an IGBT (insulated-gate bipolar transistor) or a MOSFET (metal oxide semiconductor field-effect transistor). Furthermore, the semiconductor chip can also comprise another semiconductor component, in particular a power semiconductor component, and/or an optoelectronic semiconductor chip such as a light-emitting diode chip, or can be such a component. The semiconductor chip can be based, for example, on SiC, GaAs or GaN, in other words it can be a SiC, GaAs or GaN chip.

Furthermore, the electronic device can comprise at least one first carrier. A carrier can also be referred to here and in the following as a substrate, substrate carrier or structural ceramic. The electronic device can also be referred to as a system package.

The first carrier can comprise a cavity in which the semiconductor chip is arranged. In particular, the semiconductor chip can be arranged completely buried in the cavity. If an element is arranged completely buried in a cavity, this can mean, in particular, that the cavity has a depth greater than a thickness of the element, including possible bonding layers for the electrical and/or mechanical assembly of the element. As an alternative, the semiconductor chip can be arranged partially buried in the cavity. In other words, the cavity can have a depth that is less than the thickness of the semiconductor chip, so that the semiconductor chip partially protrudes from the cavity. Furthermore, the first carrier can comprise a flat surface that completely surrounds the cavity.

Furthermore, the electronic device can comprise a second carrier and/or a cooling element, wherein the second carrier and/or the cooling element is arranged on the first carrier and covers the semiconductor chip in the cavity. In particular, this allows the semiconductor chip to be hermetically enclosed in the cavity. If the semiconductor chip is arranged partially buried in a cavity in the first carrier and has a portion which protrudes from the cavity of the first carrier, the second carrier or cooling element can comprise a corresponding cavity in which the protruding part of the semiconductor chip is arranged. In this case the cavity of the first carrier and the cavity of the second carrier or cooling element can be embodied particularly preferably symmetrical.

The first carrier and/or the second carrier can comprise one or more of the following features:

1. An electrically conducting or electrically insulating ceramic material, selected in particular from AlN, BN, $Al_2O_3$, SiC, SiN, ZnO, BeO.

2. A metallic layer, particularly preferably having a material selected from Cu, Ag, W, Mo, Ti, Au, Ni, Zn and composites and alloys thereof on at least one surface, in particular on at least one surface facing towards or away from the semiconductor chip, the other carrier, or a cooling element. In particular, at least one of the carriers can comprise a ceramic material that is arranged between two metallic layers.

3. At least one electrical and/or thermal via and/or at least one inner electrode and/or conductor track, for example, having a material selected from Cu, Ag, W, Mo, Ti, Au, Ni, Zn, in this case preferably Ag and/or Cu and particularly preferably W, as well as composites and alloys with one or more of the above-mentioned materials. By means of electrical vias, internal electrodes and conductor tracks, interconnection structures and interconnection levels can be formed in at least one of the carriers. Together with a suitable ceramic material, at least a portion of a carrier can also have an electrical functionality, for example in the form of a varistor, a PTC element and/or an NTC element. Thermal vias can be provided to improve the heat dissipation. Furthermore, the first and/or second carrier can be constructed in multilayer technology. In particular, the respective carrier can be fabricated by means of LTCC or HTCC technology.

4. At least one functional component. The at least one functional component can comprise or be a passive or active electronic or electrical element. In particular, the at least one functional component can comprise one or more of the following elements:
a PTC element,
a NTC element, a varistor,
an arrester,
a multilayer component,
an inductor,
a capacitor,
an ohmic resistor.

The at least one functional component can be embodied in the form of a discrete component which is integrated in the first or second carrier. Alternatively, the at least one functional component can be formed by a sub-region of the first and/or second carrier. In this case, the first or second carrier in said sub-region can comprise a ceramic material and internal electrode layers, which form the functional component.

In the case of a discrete component the at least one functional component can preferably be arranged in a cavity in the first or second carrier, alone or with at least one or more other functional components, in particular fully or partially buried. The cavity can adjoin a top side of the carrier or else be formed in the interior of the carrier. In particular, the at least one functional component and the semiconductor chip can be interconnected by means of vias, internal electrodes and conductor tracks which are formed in the respective carrier. In particular, a plurality of identical or different functional components can be integrated in the first and/or second carrier. Due to their arrangement in one or more cavities the one or more components can be particularly preferably hermetically encapsulated, for example by means of a cavity in the interior of one carrier or by means of a cavity on a top side of one carrier, which is covered and sealed by another carrier, a metallic layer and/or a cooling element.

Furthermore, a cooling element can be arranged on a surface of the first and/or second carrier. The cooling element can be arranged particularly preferably on a top side of the respective carrier, facing away from the semiconductor chip. It is also possible to arrange a cooling element, which can be, for example, a heat spreader, an air cooler and/or a water cooler, on each carrier. The cooling element can comprise, for example, a heat sink, preferably with or made of metal, which has cooling ribs, cooling fins or other surface-area increasing structures, on an outer side.

Furthermore, a bonding layer can also be arranged at least between the first and second carrier and/or at least between one carrier and a cooling element. The bonding layer can comprise one or more of the following materials:
  glass;
  metal, in particular one or more selected from microsilver (µAg), for example, for a sintered layer, Ag, Au, for example, for a thermosonic bonding-based connection technology, AuSn, for example, for a thermo-compression bonding-based connection technology, SnAgCu, Cu—$Si_3N_4$—Cu, for example for soldered connections;
  ceramic, for example $Si_3N_4$, or preferably, AlN;
  thermal conductive adhesive, for example, epoxy resin filled with $Si_3N_4$ and/or AlN.

Furthermore, it can also be possible that the second carrier comprises a printed circuit board (PCB) or is embodied as a printed circuit board.

The electronic device described here permits the integration of functional active and passive structures or components in a thermal substrate while at the same time ensuring thermal and/or electrical connection of the structures and/or components, for example, by means of thermally and/or electrically conductive vias, on/in the substrate, as well as ensuring the external contacting capabilities, in particular thermal and/or electrical, of the overall system thus created. Furthermore, the electronic device can enable miniaturization with higher power density and higher mechanical, particularly thermo-mechanical resilience, and operation at temperatures of up to 175° C. and above.

The electronic device can additionally enable a good matching of the thermo-mechanical expansion between the functional components and the structural ceramic and the cooling system. Furthermore, a simplified fabrication can be possible by using the fewest possible different connection and joining processes for the system package, and by extensive use of so-called co-firing processes, such as HTCC ("high-temperature co-fired ceramics") or LTCC ("low-temperature co-fired ceramics"), in particular for producing the carriers and their electrical and/or thermal vias, conductor tracks and internal electrodes in a single-layer or multilayer structure.

Furthermore, the electronic device can enable the use of the substrate ceramic for realizing passive functions, such as, in particular, a capacitor and/or an arrester functionality, and in the case of a ZnO-based carrier, in particular, a varistor functionality, by using a suitable configuration of internal electrodes and possible cavity designs in the design of the substrate geometry, in particular including the substrate inner geometry, and potentially other passive functions, in particular, for example, functionalities of a varistor and/or PTC and/or NTC components (PTC: "positive temperature coefficient" thermistor, NTC: "negative temperature coefficient" thermistor), by an appropriate choice of the substrate ceramic or parts of the substrate ceramic.

In particular, the electronic device described here can comprise one or more of the following features:
  Assembly of the first carrier and/or the second carrier as a thermal substrate, in particular as a multilayer substrate, with one or more cavities and one or more integrated functional components.
  Direct thermal connection of functional components to the cooling system, in particular one or more cooling elements.
  Hermetic encapsulation of the functional components.
  Symmetrical structure for compensation of thermo-mechanical stress, in particular by the use of the first carrier in combination with the second carrier and/or by the arrangement of two cooling elements on different sides of the first carrier or on different sides of the combination of both carriers.
  Due to a symmetrical connection of the semiconductor chip the improved thermal conductivity can be exploited.

The technology described here enables an electronic device to be built, in particular a compact power module such as an IGBT module or a power MOSFET module, having one or more of the following advantageous properties in comparison to the prior art:
  higher mechanical robustness;
  higher power density;
  lower thermal resistances;
  improved matching of the thermal expansion differences between components and thermal structural ceramics;
  better connection capability to cooling systems;
  simplified manufacturing process.

BRIEF DESCRIPTION OF THE DRAWINGS

Further advantages, advantageous embodiments and further developments arise from the exemplary embodiments, described hereafter in connection with the figures.

In the drawings.

DETAILED DESCRIPTION OF ILLUSTRATIVE EMBODIMENTS

Figure 1:
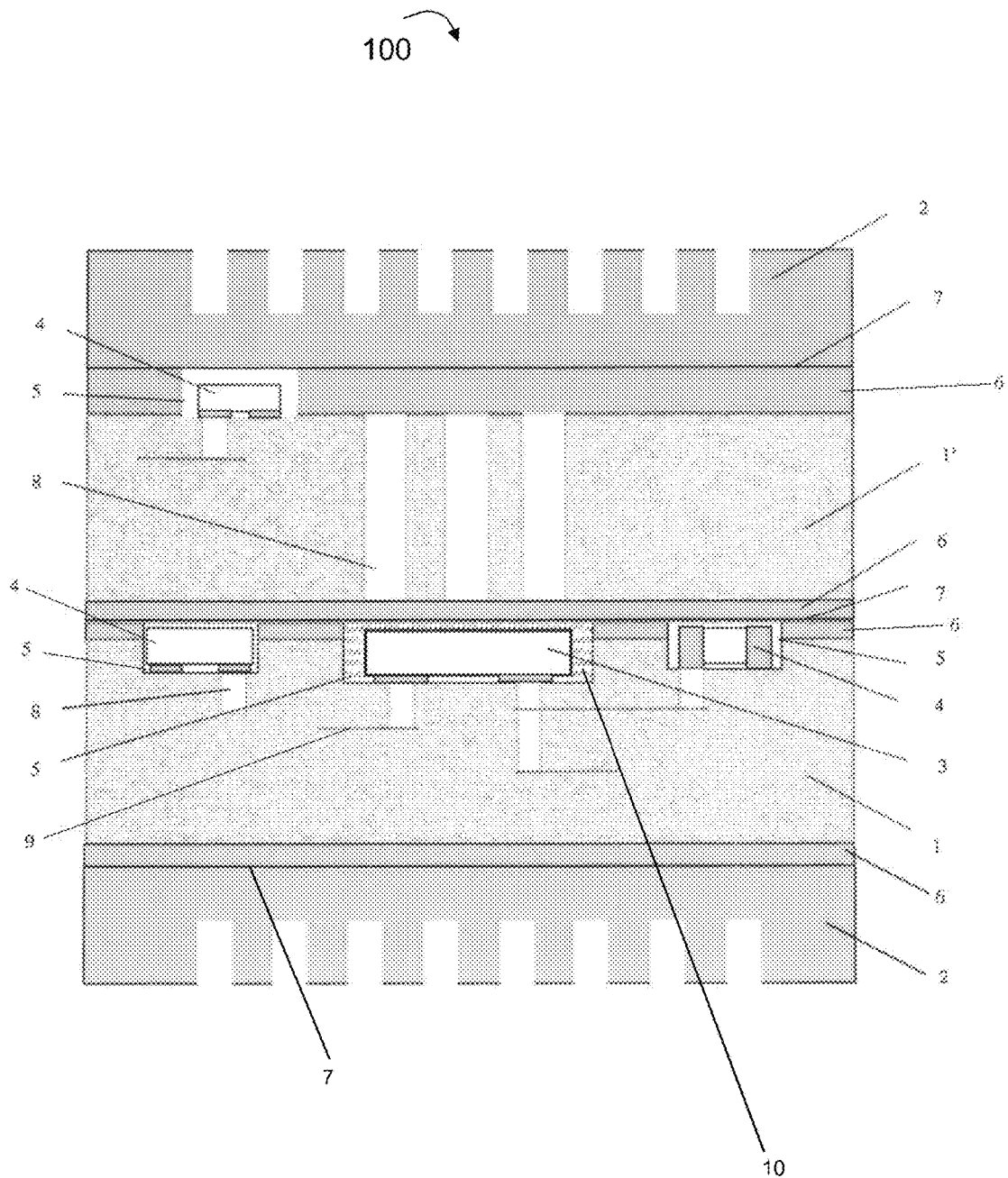
FIG. 1 shows a schematic illustration of an electronic device according to an exemplary embodiment.

In the embodiments and figures, identical, similar or equivalently functioning elements can each be labelled with the same reference numerals. The illustrated elements and their relative proportions are not to be regarded as true to scale; rather, individual elements, such as layers, components, modules and regions, can be represented exaggerated in size for better illustration and/or better comprehension.

FIG. 1 shows an embodiment of an electronic device 100.

The electronic device 100 has a first and a second carrier 1, 1' in the form of thermally conductive substrates, each of which has a ceramic body with a thermally conductive ceramic material, such as AlN, in particular multi-layer AlN, BN, $Al_2O_3$, SiC, SiN, ZnO and/or BeO. On the top sides of the ceramic bodies, the carriers 1, 1' have metallic layers 6, for example, a material selected from Cu, Ag, W, Mo, Ti, Au, Ni, Zn, as well as composites and alloys thereof. In particular, the carriers 1, 1' as shown can be designed in each case in the form of a sandwich structure, in which the ceramic body is arranged between the metallic layers 6.

The substrates 1, 1' are embodied in particular in multi-layer technology, in particular LTCC or HTCC, and have integrated internal electrodes and conductor tracks 9 as well as electrical and thermal vias 8. The conductor tracks and the electrical connection vias form interconnection structures and interconnection levels in the carriers 1, 1' while the thermal vias provide an integrated connection to a cooling system. For this purpose, on the outer sides of the laminate formed by the first and second carrier 1, 1', cooling elements 2 are applied, which purely as examples are embodied as air coolers having heat sinks with integrated cooling fins. Heat spreaders and/or water coolers are also possible. The thermal vias 8 of the second carrier 1' allow an effective heat transport from the semiconductor chip 3 described in the following to the cooling element 2 arranged on the second carrier 1'.

The carriers 1, 1' have cavities 5 in the ceramic material and/or in a metallic layer 6 for the integration of the semiconductor chip 3 and functional components 4. In the embodiment shown, the first carrier 1 has a cavity 5 in a metallic layer 6 and the ceramic material, in which cavity the semiconductor chip 3, for example, a transistor chip such as an IGBT or MOSFET, a different power semiconductor component or a light-emitting diode chip, is arranged buried and is electrically and thermally connected via the above-described interconnection structure. Active or passive functional components 4 are arranged in additional similar cavities 5. The cavities 5 can be particularly preferably formed such that they are fitted exactly to the semiconductor chip 3 or the components 4.

Due to the arrangement of the second carrier 1' over the cavities 5 of the first carrier 1, the elements arranged in the cavity can be hermetically encapsulated. The second carrier 1' has a cavity 5 in a metallic layer 6, in which a functional component 4 is also arranged and electrically and thermally connected. Due to the arrangement of the cooling elements 2 over it, this cavity can also be hermetically sealed. The cavities 5, as indicated in the case of the cavity 5 for the semiconductor chip 3, can be filled with a potting compound 10 in the form of a thermally conductive filling material, such as a thermally conductive plastic. Furthermore, the potting material can also comprise or be a finely ground ceramic powder, for example, AlN, or a matrix material such as glass or plastic with an embedded ceramic powder, for example AlN. The functional components 4 can be identical or different and selected, for example, from PTC elements, NTC elements, varistors, arresters, multilayer components, inductors, capacitors, ohmic resistors.

Between the carriers 1, 1' and between each of the carriers 1, 1' and the cooling element 2 positioned above it, bonding layers 7 are arranged. The bonding layers 7 can be designed to be all the same or different and comprise, for example, glass, metal or a ceramic material, such as $Si_3N_4$, AlN, Ag, Au, AuSn and/or SnAgCu. A thermal conductive adhesive is also possible. Advantageous bonding technologies can include for example the following:

ceramic-glass-ceramic;

ceramic-metal-ceramic, in particular silver sintering with μAg, thermosonic bonding with Au, thermo-compression bonding with AuSn, Au, soldering with AuSn, SnAgCu, Cu—$Si_3N_4$—Cu.

Figure 2:
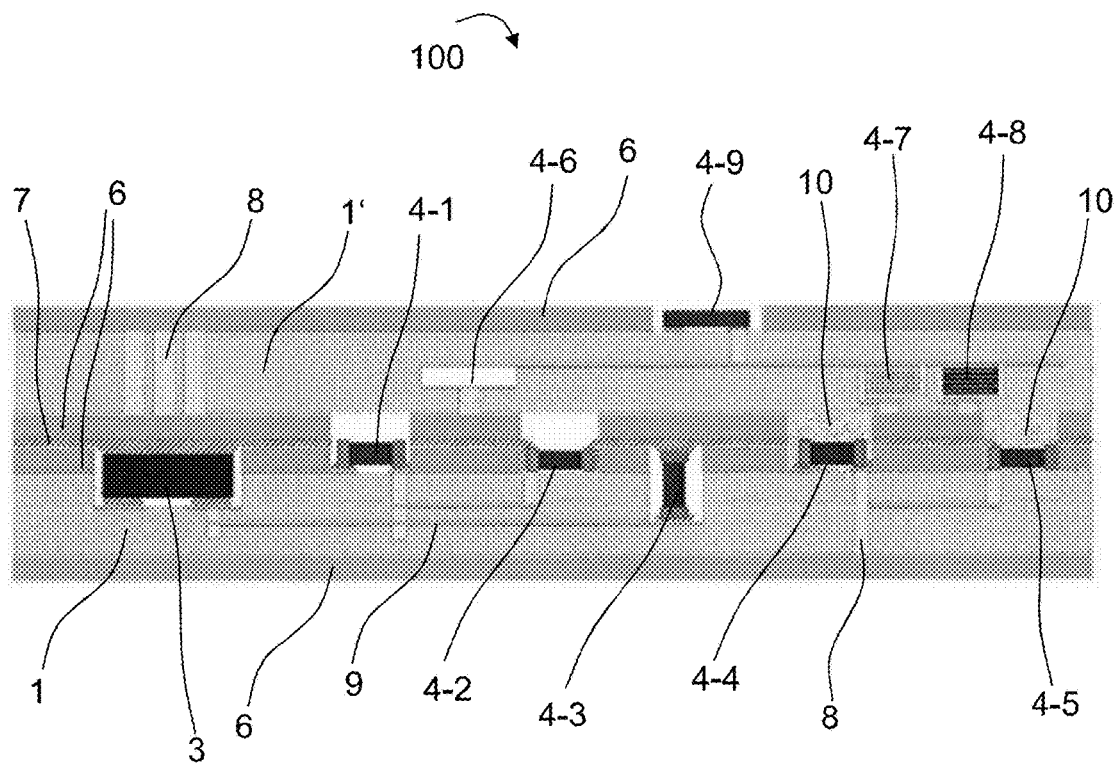
FIG. 2 shows a schematic illustration of an electronic device according to a further exemplary embodiment.

FIG. 2 shows a further embodiment of an electronic device 100, which in addition to the semiconductor chip 3, which can be embodied as a power semiconductor and/or as a flip-chip, has a plurality of functional components 4-1, . . . , 4-9 in cavities in the first and second carrier 1, 1' or formed by sub-regions of the first or second carrier 1, 1', wherein for the sake of clarity the cavities are not labeled with reference signs. The number, connection method and interconnection of the functional components 4-1, . . . , 4-9 shown are to be understood purely as examples and can differ from the embodiment shown in FIG. 2.

The electronic device 100 shown in FIG. 2, in comparison to the previous embodiment, has no cooling elements. Alternatively, cooling elements such as those described in conjunction with FIG. 1 can also be present. The first and second carrier 1, 1' are each produced in multilayer technology and form ceramic substrates with a substrate ceramic, for example, a ceramic material identified in conjunction with the previous embodiment.

The functional components 4-1, . . . , 4-9, can be identical or different and selected, for example, from active or passive components such as PTC elements, NTC elements, varistors, arresters, multilayer components. In particular, the components 4-1, . . . , 4-5 in the embodiment shown are passive components. The components 4-1 and 4-4 in the embodiment shown are both SMD-mounted (SMD-standard), the component 4-4 being arranged in an electrically non-conductive potting compound 10. The components 4-2 and 4-5 are both laterally SMD-mounted, the component 4-5 also being arranged in an electrically non-conductive potting compound 10. The component 4-3 is vertically SMD-mounted. The component 4-6 is embodied as an arrester. The component 4-7 is embodied as a multilayer component with the substrate ceramic, formed by a sub-region of the second carrier 1', while the component 4-8 is embodied as a multilayer component with a functional ceramic integrated in the carrier 1', formed by a sub-region of the second carrier 1'. The component 4-9 is a passive component embodied as a flip-chip.

In addition to the components shown, functional components such as resistors, inductors and/or capacitors can be embodied in the embodiments shown using pastes.

As an alternative to the embodiments shown, the upper cooling element shown in FIG. 1 can also be arranged directly on the first carrier and thus directly over the cavities in the first carrier, so that the electronic device then has only one carrier. Furthermore, the upper half, i.e., the second carrier in FIG. 1 and the cooling element arranged thereon, does not have to be present, so that the electronic device can then have only half the structure of the embodiment shown in FIG. 1. Furthermore, the second carrier can also be embodied as a PCB.

Figure 3:
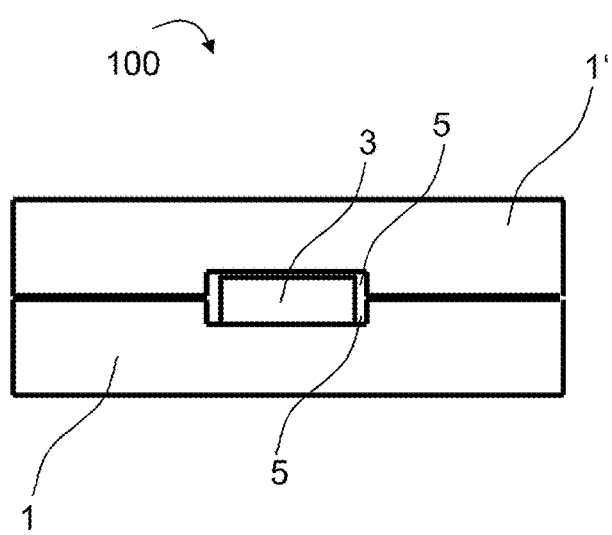
FIG. 3 shows a schematic illustration of an electronic device according to yet another embodiment.

FIGS. 1 and 2 show embodiments of the electronic device, in which the semiconductor chip is arranged completely buried in a cavity in the carrier. FIG. 3 shows another embodiment of an electronic device 100, in which the semiconductor chip 3 is arranged partially buried in a cavity 5 in the first carrier 1. In this case, the cavity 5 has a depth that is less than the thickness of the semiconductor chip 3, so that the semiconductor chip 3 partially protrudes from the cavity 5. A second carrier 1' is arranged above it, which can comprise a corresponding cavity 5 in which the protruding part of the semiconductor chip 3 is arranged. The cavity 5 of the first carrier 1 and the cavity 5 of the second carrier 1' can particularly preferably be embodied symmetrically, so that figuratively speaking only half the space is provided in each of the carriers 1, 1'. Furthermore, it can also be possible for the first carrier 1 and the second carrier 1' to be symmetrical with respect to their overall structure. The electronic device 100 can comprise further features, elements, properties and components according to the two previous embodiments.

The features and embodiments described in connection with the figures can be combined with each other according to further embodiments, even if not all combinations are described explicitly.

Furthermore, the embodiments described in connection with the Figures can additionally or alternatively comprise other features according to the general section of the description.

The invention is not limited to the embodiments by the fact that the description is based on them. Rather, the invention comprises each new feature, as well as any combination of features, which includes in particular every combination of features in the patent claims, even if this feature or this combination itself is not explicitly specified in the patent claims or embodiments.

The invention claimed is:

1. An electronic device comprising:
   at least one first carrier formed in multilayer technology;
   at least one semiconductor chip; and
   a second carrier comprising a printed circuit board or is formed in multilayer technology,
   wherein the first carrier has a cavity in which the semiconductor chip is partially buried so that a part of the semiconductor chip protrudes from the cavity,
   wherein the semiconductor chip is electrically and thermally connected to the first carrier,
   wherein the second carrier is arranged on the first carrier, and
   wherein the second carrier has a corresponding cavity in which the protruding part of the semiconductor chip is arranged.

2. The device according to claim 1, further comprising a cooling element, wherein the cooling element is arranged on the first carrier and covers the semiconductor chip in the cavity.

3. The device according to claim 1, wherein the first carrier or the second carrier has one or more of an electrically conducting or electrically insulating ceramic material selected from AlN, BN, $Al_2O_3$, SiC, SiN, ZnO, or BeO, a metallic layer on at least one surface, at least one electrical or thermal via or at least one internal electrode or conductor track, or at least one functional component.

4. The device according to claim 3, wherein the metallic layer comprises a material selected from Cu or Ag, W, Mo, Ti, Au, Ni, Zn or composites and alloys thereof.

5. The device according to claim 3, wherein the at least one functional component comprises one or more of a PTC element, a NTC element, a varistor, an arrester, a multilayer component, an inductor, a capacitor, or an ohmic resistor.

6. The device according to claim 3, wherein the at least one functional component is a discrete component arranged in a further cavity.

7. The device according to claim 3, wherein the at least one functional component is formed by a sub-region of the first carrier or the second carrier.

8. The device according to claim 2, wherein the first carrier or the second carrier has thermal vias providing an integrated thermal connection to the cooling element.

9. The device according to claim 2, wherein the cooling element is arranged on a surface of the first carrier or the second carrier.

10. The device according to claim 9, wherein the cooling element is embodied as an air cooler with a heat sink with integrated cooling fins, as a heat spreader or as a water cooler.

11. The device according to claim 2, wherein a bonding layer is arranged at least between the first carrier and the second carrier or at least between one of the carriers and the cooling element.

12. The device according to claim 11, wherein the bonding layer comprises one or more of a glass, a metal, a ceramic, or a thermal conductive adhesive.

13. The device according to claim 1, wherein the first carrier or the second carrier is constructed in multilayer technology.

14. The device according to claim 2, wherein the second carrier comprises the printed circuit board.

15. The device according to claim 1, wherein the cavity of the first carrier and the cavity of the second carrier are embodied symmetrically.

16. The device according to claim 15, wherein the first carrier and the second carrier are embodied symmetrically.

17. The device according to claim 1, wherein the first carrier and the second carrier are embodied symmetrically.

* * * * *